(12) United States Patent
Zhu et al.

(10) Patent No.: US 11,515,438 B2
(45) Date of Patent: Nov. 29, 2022

(54) SOLAR CELL

(71) Applicants: Tsinghua University, Beijing (CN); HON HAI PRECISION INDUSTRY CO., LTD., New Taipei (TW)

(72) Inventors: Zhen-Dong Zhu, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 393 days.

(21) Appl. No.: 15/990,929

(22) Filed: May 29, 2018

(65) Prior Publication Data

US 2018/0351007 A1 Dec. 6, 2018

(30) Foreign Application Priority Data

Jun. 6, 2017 (CN) .......................... 201710416290.1

(51) Int. Cl.
*H01L 31/00* (2006.01)
*H01L 31/028* (2006.01)
(Continued)

(52) U.S. Cl.
CPC .... *H01L 31/028* (2013.01); *H01L 31/022425* (2013.01); *H01L 31/022433* (2013.01);
(Continued)

(58) Field of Classification Search
CPC .............. H01L 31/028; H01L 31/0547; H01L 31/022425; H01L 31/022433;
(Continued)

(56) References Cited

U.S. PATENT DOCUMENTS 5,011,544 A * 4/1991 Gaddy .................. H01L 31/042
136/244
2005/0000562 A1* 1/2005 Kataoka ............ H01L 31/02013
136/251
(Continued)

FOREIGN PATENT DOCUMENTS

CN 103868909 A 6/2014

OTHER PUBLICATIONS

Wanbo Li, Xueqin Jiang, Jiancai Xue, Zhangkai Zhou, Jianhua Zhou, "Antibody modified gold nano-mushroom arrays for rapid detection of alpha-fetoprotein" Biosensors and Bioelectronics, vol. 68, pp. 468-474, Jun. 15, 2015, http://doi.org/10.1016/j.bios.2015.01.033.

*Primary Examiner* — Thanh Truc Trinh
(74) *Attorney, Agent, or Firm* — ScienBiziP, P.C.

(57) ABSTRACT

A solar cell including: a silicon substrate; a back electrode; a doped silicon layer; an upper electrode, wherein the upper electrode includes a plurality of three-dimensional nanostructures extending along a same direction; an electrode lead, wherein a direction of the electrode lead intersects with the direction of the plurality of three-dimensional nanostructures; wherein the three-dimensional nanostructures includes a first rectangular structure, a second rectangular structure, and a triangular prism structure; the first rectangular structure, the second rectangular structure, and the triangular prism structure are stacked, a first width of a bottom surface of the triangular prism structure is equal to a second width of a top surface of the second rectangular structure, and is greater than a third width of a top surface of the first rectangular structure, materials of the first rectangular structure and the triangular prism structure are metal.

10 Claims, 13 Drawing Sheets

(51) Int. Cl.
*H01L 31/0224* (2006.01)
*H01L 51/00* (2006.01)
*H01L 31/18* (2006.01)
*H01L 31/0352* (2006.01)
*H01L 31/054* (2014.01)
*H01L 31/068* (2012.01)

(52) U.S. Cl.
CPC ............... *H01L 31/022441* (2013.01); *H01L 31/035281* (2013.01); *H01L 31/0547* (2014.12); *H01L 31/068* (2013.01); *H01L 31/1804* (2013.01); *H01L 51/0048* (2013.01); *Y02E 10/50* (2013.01)

(58) Field of Classification Search
CPC ....... H01L 31/02241; H01L 31/035281; H01L 31/068; H01L 31/1804; H01L 51/0048; Y02E 10/50
See application file for complete search history.

(56) References Cited

U.S. PATENT DOCUMENTS

| | | | |
|---|---|---|---|
| 2005/0241692 A1* | 11/2005 | Rubin | H01L 31/0508 136/256 |
| 2009/0142880 A1* | 6/2009 | Weidman | H01L 31/022425 438/98 |
| 2009/0221111 A1* | 9/2009 | Frolov | H01L 31/0543 257/E31.127 |
| 2010/0206380 A1* | 8/2010 | Lindquist | H01L 51/42 136/261 |
| 2012/0103385 A1* | 5/2012 | Hong | H01L 31/0547 136/244 |
| 2012/0273043 A1* | 11/2012 | Lochtefeld | H01L 31/06875 136/261 |
| 2012/0318342 A1* | 12/2012 | Dimitrakopoulos | G06F 11/0727 136/256 |
| 2016/0043245 A1* | 2/2016 | Matsumaru | H01L 31/022425 136/256 |

* cited by examiner

SOLAR CELL

CROSS-REFERENCE TO RELATED APPLICATIONS

This application is related to applications entitled, "LIGHT EMITTING DIODE", filed May 29, 2018, Ser. No. 15/990,958, "METHOD OF DETECTING SINGLE MOLECULES", filed May 29, 2018, Ser. No. 15/990,933.

FIELD

The subject matter herein generally relates to a solar cell.

BACKGROUND

Solar cells can convert light energy into electrical energy. Solar cells work via photovoltaic effects of the semiconductor materials. Solar cells can be silicon solar cells, gallium arsenide solar cells, or organic thin film solar cells.

A silicon solar cell generally includes a back electrode, a silicon substrate, a doped silicon layer and an upper electrode disposed in that sequence. The silicon substrate and the doped silicon layer can form a number of P-N junctions, the P-N junctions can produce a number of electron-hole pairs under excitation of the sunlight. Metal mesh is usually used as the upper electrode. However, the metal material has a poor sunlight transmittance, thus the utilization efficiency of the solar cell is relatively low.

What is needed, therefore, is to provide a solar cell for solving the problem discussed above.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will now be described, by way of example only, with reference to the attached figures, wherein.

DETAILED DESCRIPTION

Figure 1:
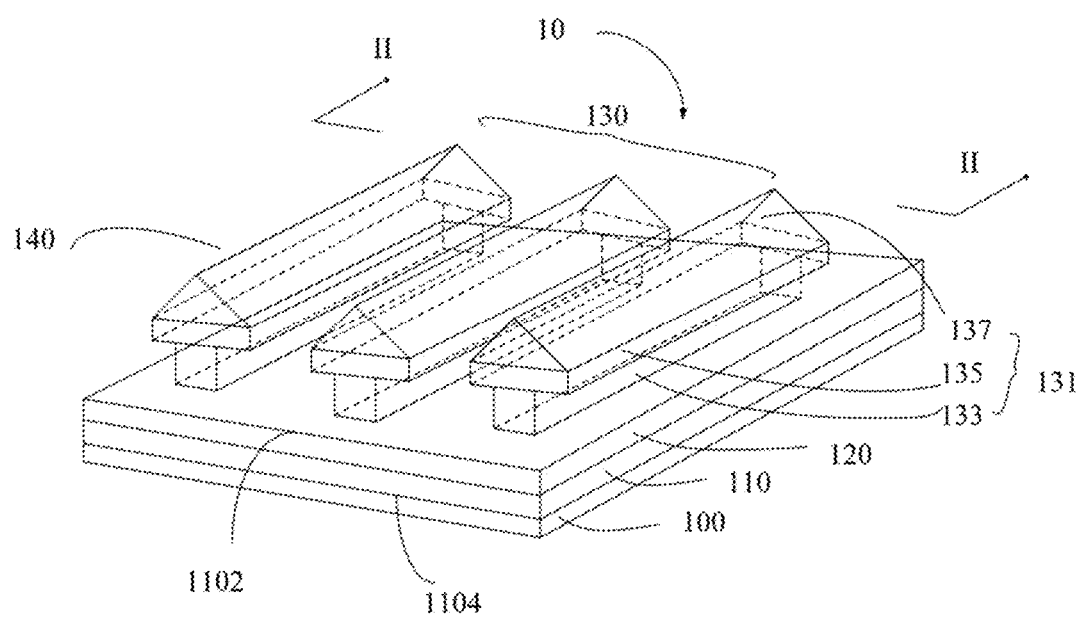
FIG. 1 is a structural schematic view of one embodiment of a solar cell.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better details and features. The description is not to be considered as limiting the scope of the embodiments described herein.

Several definitions that apply throughout this invention will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Figure 2:
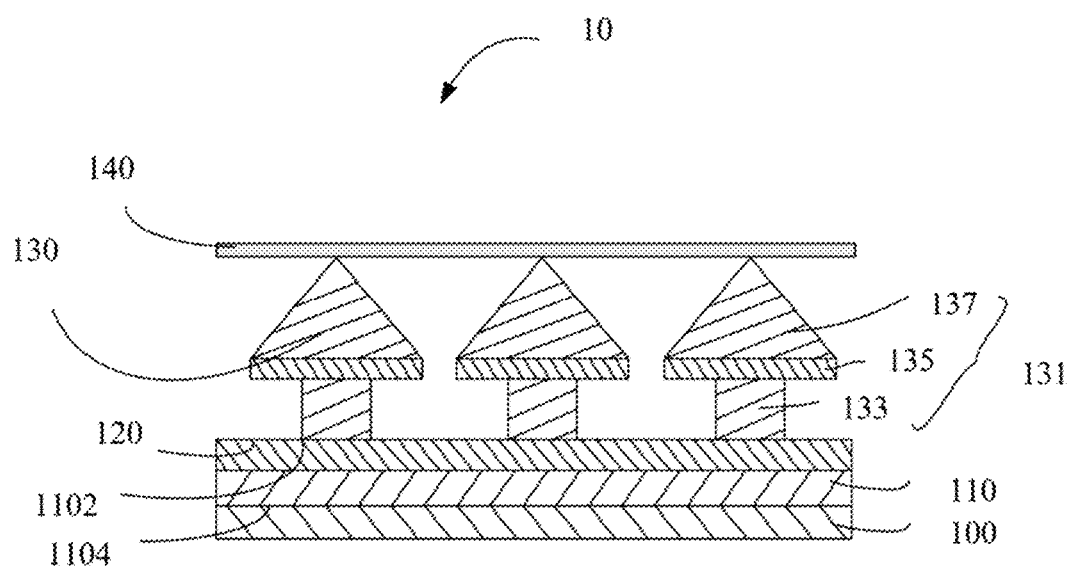
FIG. 2 is a sectional view of the solar cell of FIG. 1.

Referring to FIG. 1 and FIG. 2, an embodiment of a solar cell 10 is provided. The solar cell 10 comprises a back electrode 100, a silicon substrate 110, a doped silicon layer 120, and an upper electrode 130. The silicon substrate 110, the doped silicon layer 120 and the upper electrode 130 are stacked in that order and located on a surface of the back electrode 100. The upper electrode 130 includes a plurality of three-dimensional nanostructures 131.

The silicon substrate 110 defines a first surface 1102 and a second surface 1104. The back electrode 10 is located on and in Ohmic contact with the second surface 1104 of the silicon substrate 110. The doped silicon layer 120 is located on the first surface 1102 of the silicon substrate 110.

A material of the back electrode 10 can be metal material or carbon material. The metal material can be aluminum, magnesium, or silver. The carbon material can be carbon nanotube or graphene. The carbon nanotube can be carbon nanotube drawn film, carbon nanotube rolled film, carbon nanotube flocculated film, or carbon nanotube wire.

The silicon substrate 110 can be a P-type silicon substrate. A material of the silicon substrate 110 can be single crystal silicon, multiple crystal silicon, or other P-type semiconductor materials. In one embodiment, the material of the silicon substrate 110 is P-type single crystal silicon. A thickness of the silicon substrate 110 ranges from about 200 micrometers to about 300 micrometers.

The doped silicon layer 120 can be an N-type doped silicon layer. The doped silicon layer 120 can be formed by injecting N-type doped material, such as phosphorus or arsenic. A thickness of the doped silicon layer 120 can range from about 10 nanometers to about 1 micrometer. The thickness of the doped silicon layer 120 can range from about 40 nanometers to about 1 micrometer.

An interface between the doped silicon layer 120 and the silicon substrate 110 forms a plurality of P-N junctions that can be used to convert solar energy to electrical energy.

The upper electrode 130 includes a plurality of three-dimensional nanostructures 131. The plurality of three-dimensional nanostructures 131 can be arranged side by side and extend along a straight line, a fold line, or a curve line. The extending direction is parallel to a surface of the doped silicon layer 120. The extending direction can be any direction which is parallel to the surface of the doped silicon layer 120. The term "side by side" means that two adjacent three-dimensional nanostructures 131 are substantially parallel with each other along the extending direction. The distance between two adjacent three-dimensional nanostructures 131 is in a range from 0 nanometer to 200 nanometers. The plurality of three-dimensional nanostructures 131 can be continuous or discontinuous along the extending direction. In one exemplary embodiment, the plurality of three-dimensional nanostructures 131 are continuous, the extending direction of the three-dimensional nanostructures 131 extends side by side, the three-dimensional nanostructures are strip-shaped structures, and cross sections of the three-dimensional nanostructures have the same pine shapes and the same area.

The three-dimensional nanostructures 131 are pine shaped ridges located on the surface of the doped silicon layer 120. The pine shaped ridges comprise a first rectangular structure 133, a second rectangular structure 135, and a triangular prism structure 137. The first rectangular structure 133 comprises a first top surface 1332, and the first top surface 1332 is away from the doped silicon layer 120. The second rectangular structure 135 is located on the first top surface 1332. The second rectangular structure 135 comprises a second top surface 1352, and the second top surface 1352 is away from the first rectangular structure 133. The triangular prism structure 137 is located on the second top surface 1352. The geometric centers of the first rectangular structure 133, the second rectangular structure 135 and the triangular prism structure 137 are on the same axis. The first rectangular structure 133 and the triangular prism structure 137 are both metal layers. The second rectangular structure 135 can isolate the first rectangular structure 133 and the triangular prism structure 137.

Figure 3:
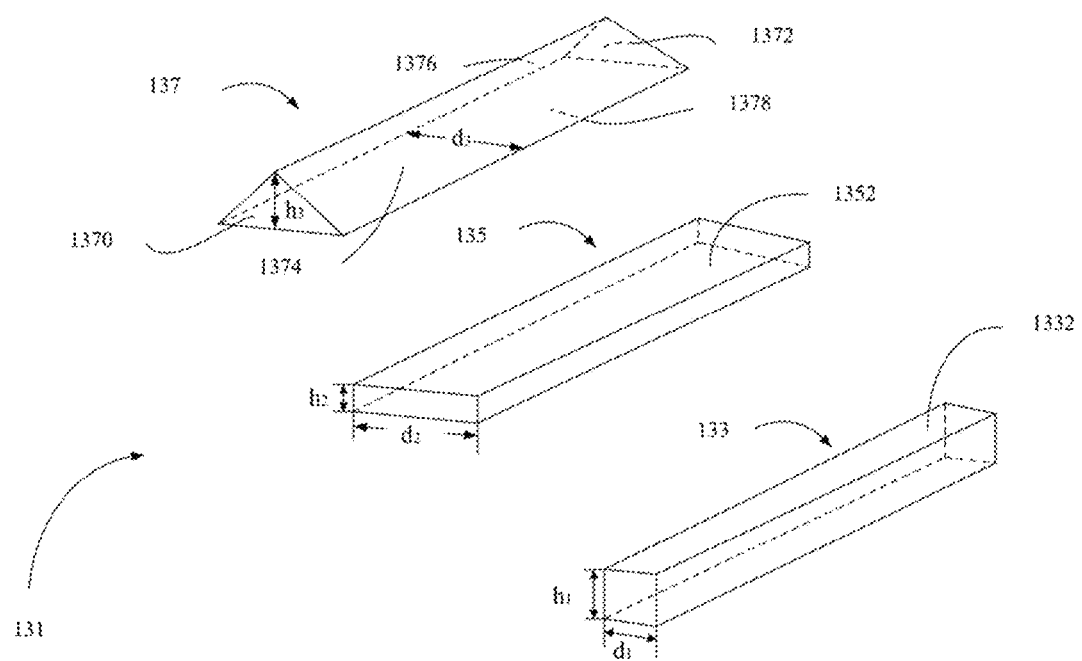
FIG. 3 is an exploded view of one embodiment of the three-dimensional nanostructures.

Referring to FIG. 3, the triangular prism structure 137 comprises a first triangle surface 1370 and a second triangle surface 1372 opposite to and substantially parallel with the first triangle surface 1370. The sizes and shapes of the first triangle surface 1370 and the second triangle surface 1372 are both the same. The triangular prism structure 137 further comprises a first rectangular side 1374, a second rectangular side 1376, and a third rectangular side 1378 connected to the first triangle surface 1370 and the second triangle surface 1372. The projection of the first triangle surface 1370 coincides with the projection of the second triangle surface 1372. The shapes of the first triangle surface 1370 and the second triangle surface 1372 are both isosceles triangle. The third rectangular side 1378 is in contact with the second top surface 1352 of the second rectangular structure 135. The side surface of the first rectangular structure 133 is perpendicular to the surface of the doped silicon layer 120. The side surface of the second rectangular structure 135 is perpendicular to the first top surface 1332 of the first rectangular structure 133, thus the side surface of the second rectangular structure 135 is also perpendicular to the surface of the doped silicon layer 120.

The width $d_1$ of the first rectangular structure 133 is in a range of 5 nanometers to 400 nanometers, the height $h_1$ of the first rectangular structure 133 is in a range of 20 nanometers to 500 nanometers. Furthermore, the width $d_1$ of the first rectangular structure 133 can be in a range of 12 nanometers to 320 nanometers, the height $h_1$ of the first rectangular structure 133 can be in a range of 50 nanometers to 200 nanometers. In one exemplary embodiment, the width $d_1$ of the first rectangular structure 133 is 50 nanometers, the height $h_1$ of the first rectangular structure 133 is 100 nanometers. The width $d_2$ of the second rectangular structure 135 is in a range of 50 nanometers to 450 nanometers, the height $h_2$ of the second rectangular structure 135 is in a range of 5 nanometers to 100 nanometers. Furthermore, the width $d_2$ of the second rectangular structure 135 can be in a range of 80 nanometers to 380 nanometers, the height $h_2$ of the second rectangular structure 135 can be in a range of 5 nanometers to 60 nanometers. In one exemplary embodiment, the width $d_2$ of the second rectangular structure 135 is 100 nanometers, the height $h_2$ of the second rectangular structure 135 is 10 nanometers. The width $d_3$ of the triangular prism structure 137 is in a range of 50 nanometers to 450 nanometers, the height $h_3$ of the triangular prism structure 137 is in a range of 40 nanometers to 800 nanometers. Furthermore, the width $d_3$ of the triangular prism structure 137 can be in a range of 80 nanometers to 380 nanometers, the height $h_3$ of the triangular prism structure 137 can be in a range of 130 nanometers to 400 nanometers. In one exemplary embodiment, the width $d_3$ of the triangular prism structure 137 is 100 nanometers, the height $h_3$ of the triangular prism structure 137 is 200 nanometers. The width $d_3$ of the triangular prism structure 137 is the width of the third rectangular side 1378 of the triangular prism structure 137. The width $d_3$ of the triangular prism structure 137 is equal to the width $d_2$ of the second rectangular structure 135. The third rectangular side 1378 of the triangular prism structure 137 is completely coincident with the second top surface 1352 of the second rectangular structure 135. The width $d_3$ of the triangular prism structure 137 is greater than the width $d_1$ of the first rectangular structure 133.

Figure 4:
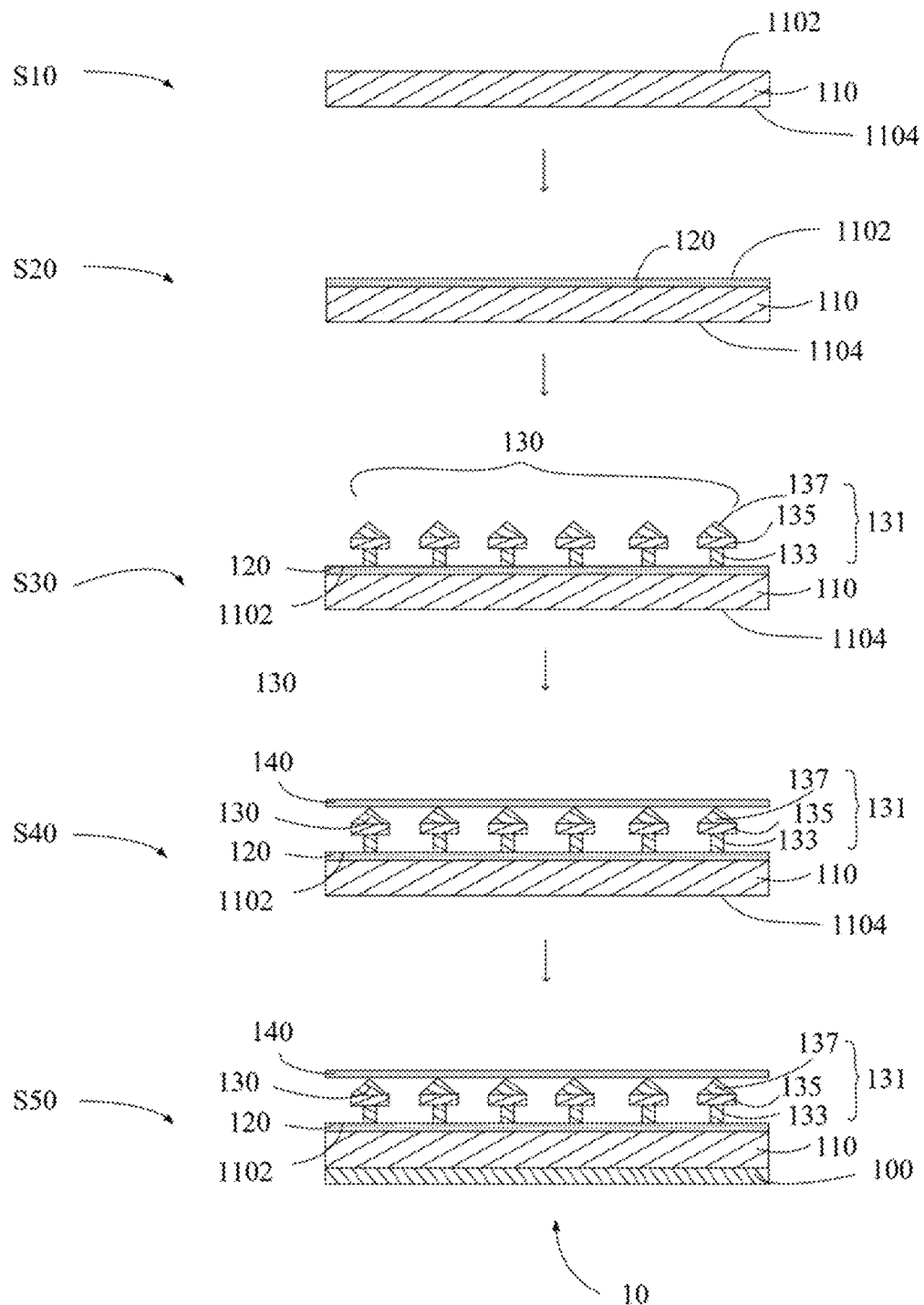
FIG. 4 is a flow chart of one embodiment of a method for making the solar cell.

Referring to FIG. 4, an embodiment of a method of making the solar cell 10 comprises:

S10, providing the silicon substrate 110, wherein the silicon substrate 110 defines the first surface 1102 and the second surface 1104 opposite to the first surface 1102;

S20, forming the doped silicon layer 120 by doping the first surface 1102 of the silicon substrate 110;

S30, locating the upper electrode 130 on the doped silicon layer 120;

S40, placing at least one electrode lead 140 on the upper electrode 130;

S50, providing the back electrode 100 on the second surface 1104 of the silicon substrate 110.

Figure 5:
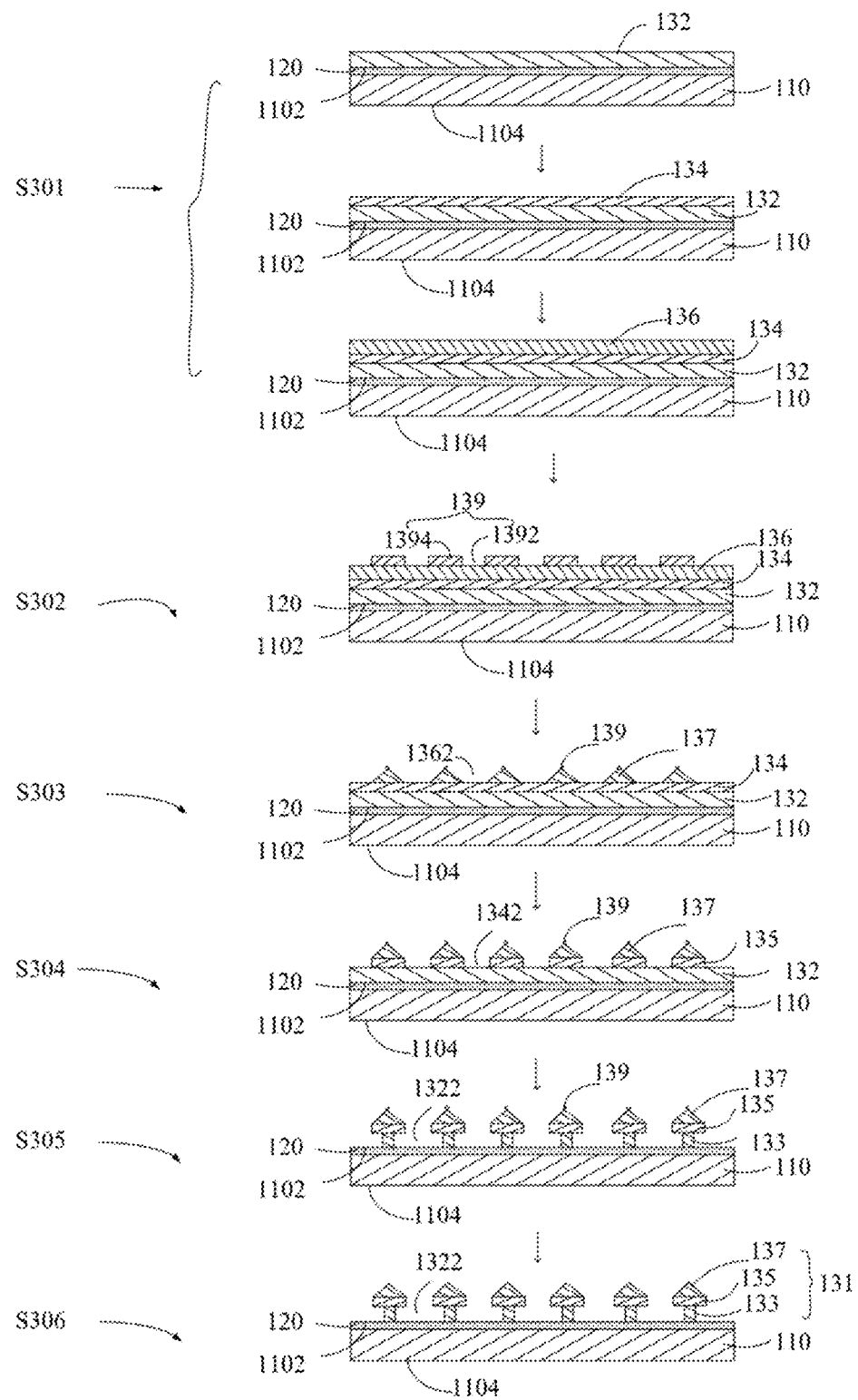
FIG. 5 is a flow chart of one embodiment of a method for making the upper electrode of the solar cell.

Referring to FIG. 5, in step S30, a method of making the upper electrode 130 comprises:

S301, forming a first metal layer 132 on the doped silicon layer 120, forming an isolation layer 134 on the first metal layer 132, and locating a second metal layer 136 on the isolation layer 134;

S302, placing a first mask layer 139 on the second metal layer 136, wherein the first mask layer 139 covers partial surface of the second metal layer 136, and other surface is exposed;

S303, etching the first mask layer 139 and the second metal layer 136 using the first mask layer 139 as a mask to obtain a plurality of triangular prism structures 137;

S304, etching the isolation layer 134 using the plurality of triangular prism structures 137 as a mask to obtain a plurality of second rectangular structures 135;

S305, etching the first metal layer 132 using the plurality of second rectangular structures 135 as a mask to obtain a plurality of first rectangular structures 133; and S306, removing the first mask layer 139 to obtain the plurality of three-dimensional nanostructures 131.

In step S301, the first metal layer 132 is deposited on the doped silicon layer 120, and the second metal layer 136 is deposited on the isolation layer 134. The method of depositing the first metal layer 132 and the second metal layer 136 can be electron beam evaporation method or ion sputtering method. The material of the first metal layer 132 and the second metal layer 136 can be metals with surface plasmon polaritons, such as gold, silver, copper, and aluminum. In one exemplary embodiment, the material of the first metal layer 132 and the second metal layer 136 is gold. The thickness of the first metal layer 132 is in a range of 20 nanometers to 500 nanometers. Furthermore, the thickness of the first metal layer 132 can be in a range of 50 nanometers to 200 nanometers. In one exemplary embodiment, the thickness of the first metal layer 132 is 100 nanometers. The thickness of the second metal layer 136 should be greater than 40 nanometers so that the second metal layer 136 can be a free-standing structure after removing the first mask layer 139. The free-standing structure is that the second metal layer 136 can keep a certain shape without any supporter. The thickness of the second metal layer 136 can be in a range of 40 nanometers to 800 nanometers. Furthermore, the thickness of the second metal layer 136 can be in a range of 130 nanometers to 400 nanometers. In one exemplary embodiment, the thickness of the second metal layer 136 is 200 nanometers.

The isolation layer 134 is used to isolate the first metal layer 132 and the second metal layer 136, thus the first metal layer 132 is not destroyed when the second metal layer 136 is etched. When the material of the first metal layer 132 is different from the material of the second metal layer 136, the isolation layer 134 can be omitted. The material of the isolation layer 134 can be metal or metal oxide, such as chromium, tantalum, tantalum oxide, titanium dioxide, silicon, or silicon dioxide. The thickness of the isolation layer 134 can be in a range of 5 nanometers to 100 nanometers. Furthermore, the thickness of the isolation layer 134 can be in a range of 5 nanometers to 60 nanometers. When the material of the isolation layer 134 is metal, the material of the isolation layer 134 should be different from the material of the first metal layer 132 and the second metal layer 136. In one exemplary embodiment, the material of the isolation layer 134 is chromium, and the thickness of the isolation layer 134 is 10 nanometers.

In step S302, the method for making the first mask layer 139 can be optical etching method, plasma etching method, electron beam etching method, focused ion beam etching method, hot embossing method, or nanoimprinting method. In one exemplary embodiment, the first mask layer 139 is formed on the second metal layer 136 by nanoimprinting method. Compared with other methods, the nanoimprinting method for making the first mask layer 139 has a plurality of advantages, such as high precision, high efficiency, low energy consumption, low temperature operation, and low cost. The first mask layer 139 includes a plurality of bodies 1394, and the body 1394 defines a plurality of fourth openings 1392 parallel with and spaced from each other. The plurality of fourth openings 1392 can be strip openings or square openings. In one exemplary embodiment, the plurality of fourth openings 1392 are strip openings, each fourth opening 1392 extends to two opposite edges of the first mask layer 139. Each adjacent body 1394 and fourth opening 1392 is defined as a period. The width of the period is in a range of 90 nanometers to 1000 nanometers. Furthermore, the width of the period is in a range of 121 nanometers to 650 nanometers. The width of each fourth opening 1392 can be equal to the width of each body 1394. The width of each fourth opening 1392 and the width of each body 1394 can also be different. The width of each fourth opening 1392 is in a range of 40 nanometers to 450 nanometers. The width of each body 1394 is in a range of 50 nanometers to 450 nanometers. In one exemplary embodiment, the width of the period is 200 nanometers, the width of each fourth opening 1392 is 100 nanometers. The height of the body 1394 is in a range of 20 nanometers to 1000 nanometers. Furthermore, the height of the body 1394 is in a range of 20 nanometers to 800 nanometers. Furthermore, the height of the body 1394 is in a range of 30 nanometers to 700 nanometers. In one exemplary embodiment, the height of the body 1394 is 200 nanometers.

In step S303, the structure obtained after the step S302 is placed in a reactive plasma system for etching, thus a plurality of parallel and spaced triangular prism structures 137 are obtained, the plurality of triangular prism structures 137 are arranged. The etching gas in the etching system is a mixed gas of a physical etching gas and a reactive etching gas. The physical etching gas can be argon gas, or helium, and the reactive etching gas can be oxygen gas, chlorine, boron trichloride, or tetrachloride carbon. The physical etching gas and the reactive etching gas can be selected according to the material of the second metal layer 136 and the first mask layer 139 so that the etching gas has a higher etching rate. For example, when the material of the second metal layer 136 is gold, platinum, or palladium, the physical etching gas is argon gas. When the material of the second metal layer 136 is copper, the physical etching gas is helium. When the material of the second metal layer 136 is aluminum, the physical etching gas is argon gas. In one exemplary embodiment, the physical etching gas is argon gas, and the reactive etching gas is oxygen gas.

The physical etching gas and the reactive etching gas are introduced into the etching system. On the one hand, the body 1394 of the first mask layer 139 is progressively etched by the reactive etching gas; on the other hand, the exposed second metal layer 136 can also be etched by the physical etching gas. As the first mask layer 139 is progressively etched, the width of the fourth opening 1392 gradually becomes greater. Since the exposed part of the second metal layer 136 corresponds to the fourth opening 1392, the etching width of the exposed part gradually becomes greater from bottom to top. The first mask layer 139 can be removed or partially removed by the reactive etching gas. The exposed part of the second metal layer 136 can be removed or partially removed by the physical etching gas. The ratio between the horizontal etching rate and the vertical etching rate can be selected by adjusting the relationship of volumetric flow, pressure and power of argon gas and oxygen gas. The triangular prism structures 137 can be obtained by adjusting the ratio. The second metal layer 136 defines a plurality of parallel and spaced third openings 1362 and comprises a plurality of triangular prism structures 137. The isolation layer 134 is exposed through the third openings 1362.

In step S304, a plurality of parallel and spaced second rectangular structures 135 can be obtained by etching the isolation layer 134. In one exemplary embodiment, the material of the isolation layer 134 is chromium, the etching gas is a mixed gas of oxygen gas and chlorine gas.

The isolation layer 134 defines a plurality of parallel and spaced second openings 1342 and comprises a plurality of second rectangular structures 135. The second openings 1342 is stripe shaped. The second openings 1342 correspond to the third openings 1362, and the second rectangular structures 135 correspond to the triangular prism structures 137. The first metal layer 132 is exposed through the second openings 1342.

In step S305, a plurality of parallel and spaced first rectangular structures 133 can be obtained by etching the first metal layer 132.

The physical etching gas and the reactive etching gas are introduced into the etching system. The physical etching gas is argon gas, and the reactive etching gas is a mixture of chlorine gas and oxygen gas. The physical etching gas and the reactive etching gas simultaneously etch the first metal layer 132.

A plurality of first openings 1322 are obtained by etching a part of the first metal layer 132 corresponding to the second openings 1342. In addition, some metal particles or powders can be produced and fall off from the first metal layer 132 during the etching process. If there is no reactive etching gas, the metal particles or powders will accumulate along the sidewalls of the first openings 1322 to form a thick edge, and that will also result in a large surface roughness of the sidewalls of the first openings 1322. A gradient of the etching rate of the first metal layer 132 along each direction tends to be stable. Since the metal particles or powders are deposited on the bottom surfaces of the first openings 1322, the accumulation of the metal particles or powders on the bottom surfaces of the first openings 1322 is equal to a reduction in the vertical etching rate and also equal to an increase in the horizontal etching rate. The excess metal particles or powders deposited on the sidewalls of the first openings 1322 can be etched by the reactive etching gas and the physical etching gas. The first rectangular structures 133 have a regular structure and a small surface roughness.

In step S305, the shape of the first openings 1322 is regular rectangle after the step S304 being completed. The width of the first openings 1322 is in a range of 10 nanometers to 350 nanometers. The width of the first openings 1322 can be controlled by adjusting the etching time. The thickness of the first rectangular structures 133 can be controlled by adjusting the etching time. In one exemplary embodiment, the width of the first openings 1322 is 160 nanometers.

Figure 6:
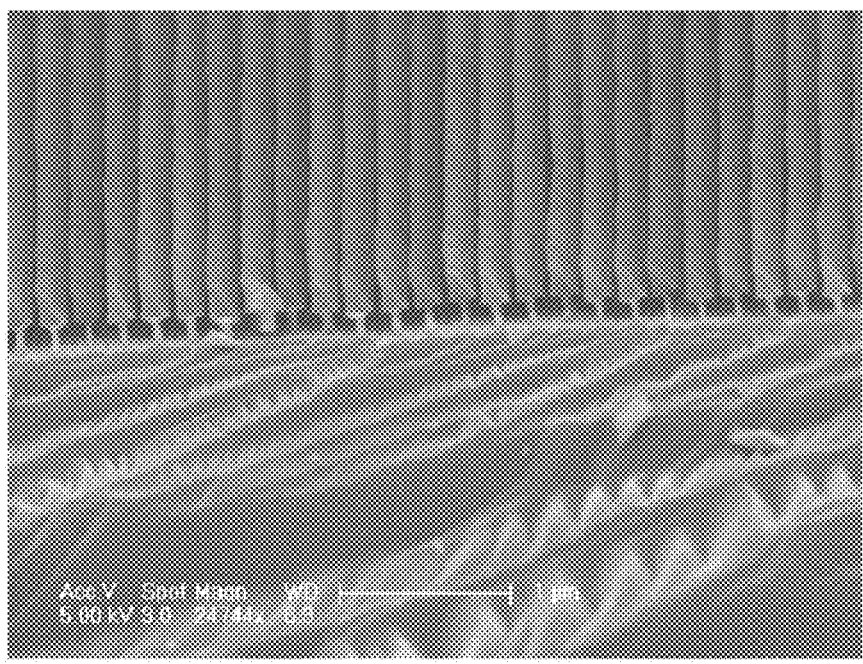
FIG. 6 is a low magnification Scanning Electron Microscope (SEM) image of the upper electrode of the solar cell.
Figure 7:
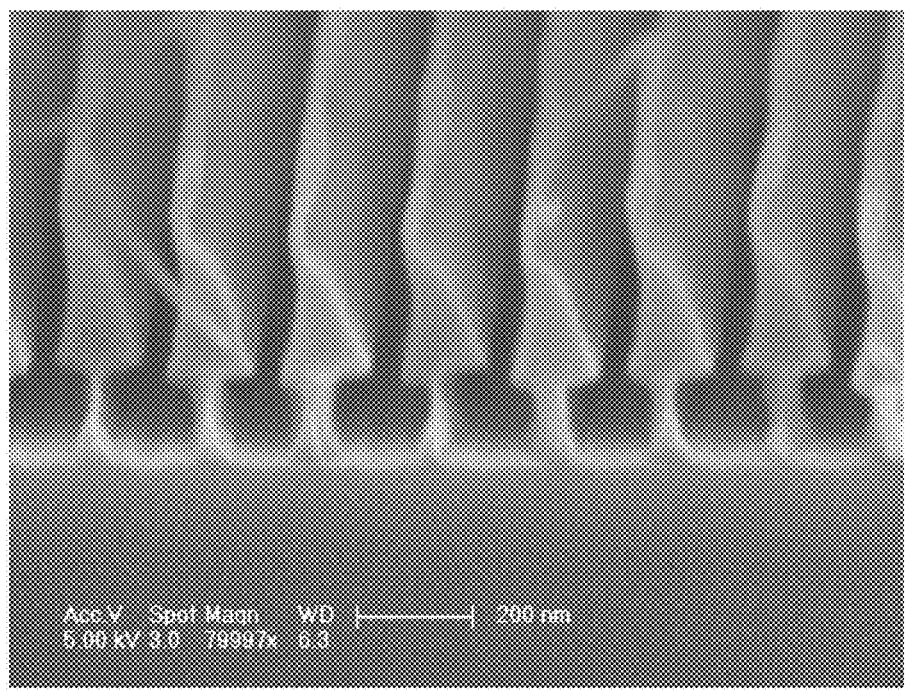
FIG. 7 is a high magnification Scanning Electron Microscope (SEM) image of the upper electrode of the solar cell.

In step S306, the residual photoresist remains in the structure obtained by step S305. The plurality of three-dimensional nanostructures 131 are obtained by removing the residual photoresist. The residual photoresist can be resolved by dissolving agent. The dissolving agent can be tetrahydrofuran (THF), acetone, butanone, cyclohexane, n-hexane, methanol, absolute ethanol, or non-toxic or low toxicity of environmentally friendly solvents. In one exemplary embodiment, the residual photoresist is removed by ultrasonic cleaning in acetone solution. FIG. 6 and FIG. 7 are SEM images of the plurality of three-dimensional nanostructures 131.

The solar cell further comprises at least one electrode lead 140. The electrode lead 140 is located on and in Ohmic contact with the upper electrode 130. The upper electrode 130 has a first area covered by the electrode lead 140 and a second area exposed to receive the sunlight. The electrode lead 140 is used to collect the current of the upper electrode 130. The electrode lead 140 extends along a second direction, and the second direction intersects with the extension direction of the plurality of three-dimensional nanostructures 131.

The material of the electrode lead 140 is conductive material, such as metal material, carbon nanotube structure, graphene. The metal can be magnesium, aluminum, or silver. The carbon nanotube structure can be an ordered carbon nanotube structure or a disordered carbon nanotube structure. The disordered carbon nanotube structure includes a plurality of intertwined carbon nanotubes. The ordered carbon nanotube structure includes a plurality of carbon nanotubes extending along a same direction.

The carbon nanotube structure can be a free-standing structure. The carbon nanotube structure can be carbon nanotube film or carbon nanotube wire. The carbon nanotube structure has a first part in contact with the upper electrode 130 and a second part being hang. In one exemplary embodiment, the electrode lead 140 is a carbon nanotube wire, the carbon nanotube wire is a free-standing structure consisting a plurality of carbon nanotubes. The carbon nanotube wire is electrically connected to the upper electrode 130 and used to collect the current converted by light via P-N junctions.

Figure 8:
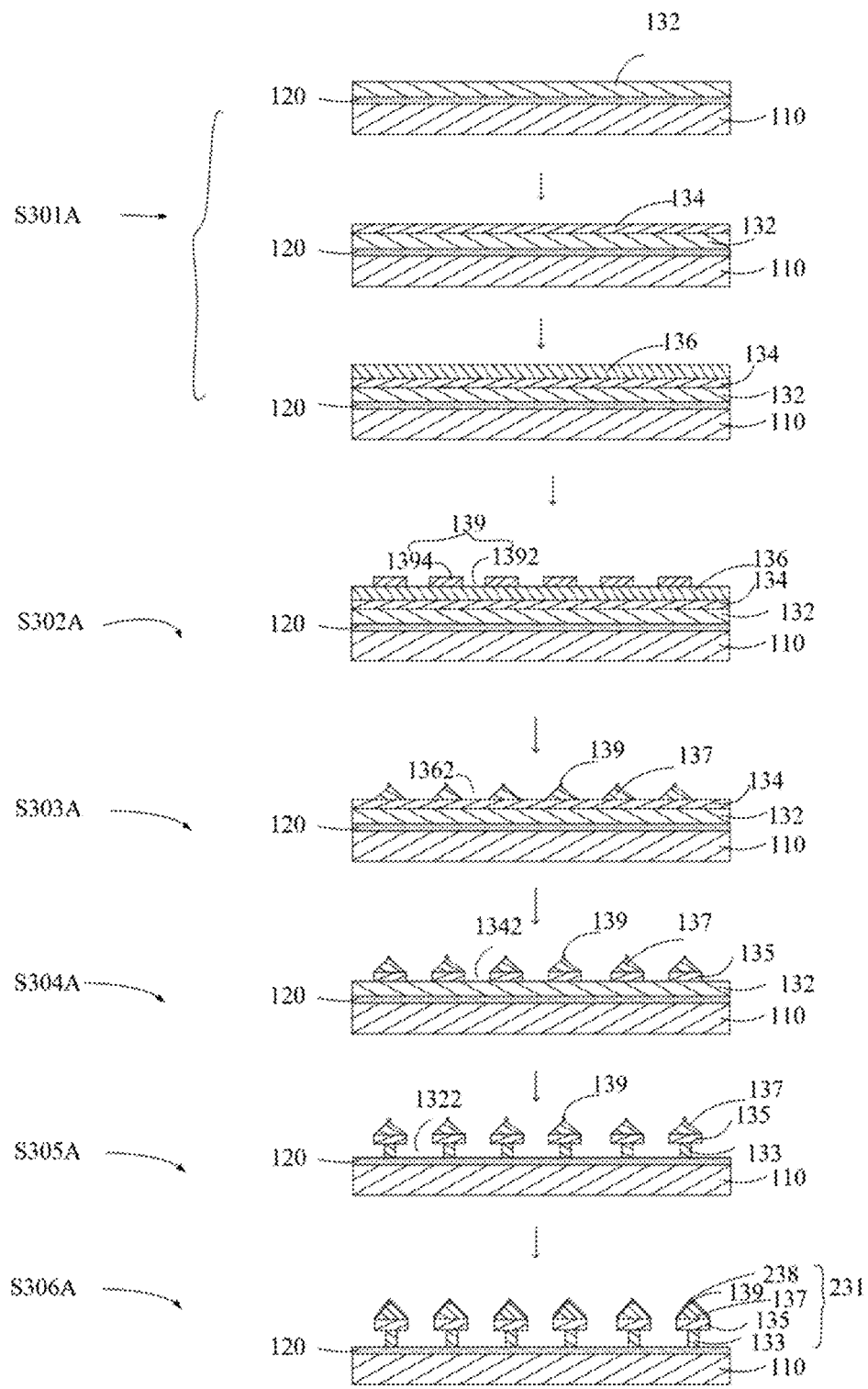
FIG. 8 is a flow chart of one embodiment of a method for making the upper electrode of the solar cell.

Referring to FIG. 8, a method of making an upper electrode 230 comprises:

S301A, forming a first metal layer 132 on the doped silicon layer 120, forming an isolation layer 134 on the first metal layer 132, and locating a second metal layer 136 on the isolation layer 134;

S302A, placing a first mask layer 139 on the second metal layer 136, wherein the first mask layer 139 covers partial surface of the second metal layer 136, and other surface is exposed;

S303A, etching the second metal layer 136 and the first mask layer 139 using the first mask layer 139 as a mask to obtain a plurality of triangular prism structures 137;

S304A, etching the isolation layer 134 using the plurality of triangular prism structures 137 as a mask to obtain a plurality of second rectangular structures 135;

S305A, etching the first metal layer 132 using the plurality of second rectangular structures 135 as a mask to obtain a plurality of first rectangular structures 133; and S306A, depositing a third metal layer 238 on the triangular prism structures 137 to obtain a plurality of three-dimensional nanostructures 231.

The method of making the upper electrode 230 is similar to the method of making the upper electrode 130 except that the third metal layer 238 is deposited on the triangular prism structures 137 without removing the first mask layer 139. The thickness of the third metal layer 238 is greater than 30 nanometers. In one exemplary embodiment, the thickness of the third metal layer 238 is 50 nanometers.

On the one hand, the method of depositing the third metal layer 238 on the triangular prism structures can adjust the charge distribution in the preparation process, which is beneficial to the processing. On the other hand, the mask layer don't need to be removed, so procedures of the method are simple.

Figure 9:
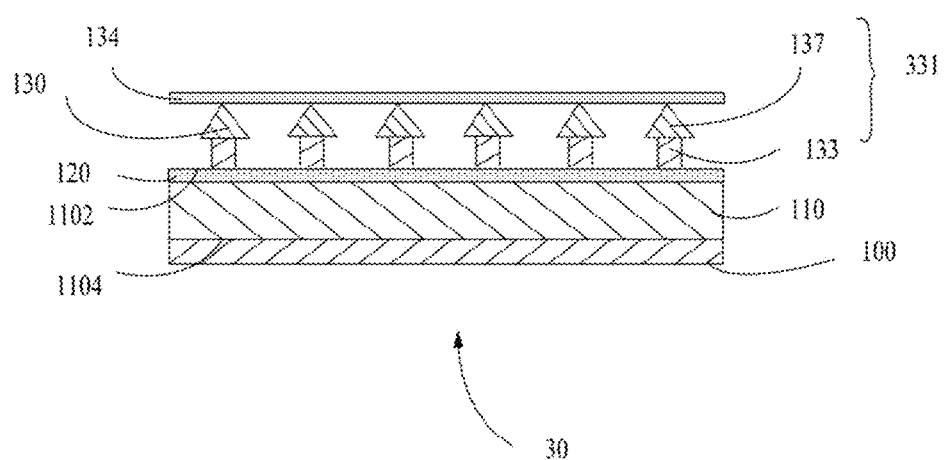
FIG. 9 is a structural schematic view of one embodiment of a solar cell.

Referring to FIG. 9, an embodiment of a solar cell 30 is provided. The solar cell 30 comprises a back electrode 100, a silicon substrate 110, a doped silicon layer 120, an upper electrode 130, and an electrode lead 140. The silicon substrate 110 defines a first surface 1102 and a second surface 1104 opposite to the first surface 1102. The back electrode 100 is located on and in Ohmic contact with the second surface 1104 of the silicon substrate 110. The doped silicon layer 120 is located on the first surface 1102 of the silicon substrate 110. The upper electrode 130 is located on the doped silicon layer 120 and includes a plurality of three-dimensional nanostructures 331. The electrode lead 140 is located on the upper electrode 130. The electrode lead 140 extends along a second direction, and the second direction intersects with the extension direction of the plurality of three-dimensional nanostructures 331. The three-dimensional nanostructures 331 comprises a first rectangular structure 133 and a triangular prism structure 137. The first rectangular structure 133 is located on the doped silicon layer 120. The triangular prism structure 137 is located on the first rectangular structure 133. The width of a bottom surface of the triangular prism structure 137 is greater than the width of a top surface of the first rectangular structure 133. The materials of the first rectangular structure 133 and the triangular prism structure 137 are both metal materials. The material of the first rectangular structure 133 is different from that of the triangular prism structure 137.

The solar cell 30 is similar to the solar cell 10 except that the three-dimensional nanostructures 331 of the solar cell 30 only consists of the first rectangular structure 133 and the triangular prism structure 137.

Figure 10:
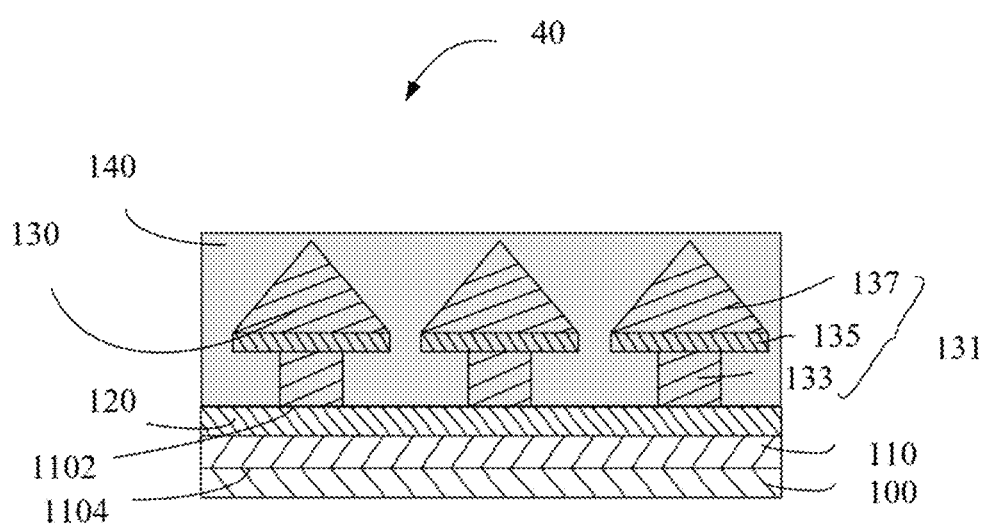
FIG. 10 is a structural schematic view of one embodiment of a solar cell.

Referring to FIG. 10, an embodiment of a solar cell 40 is provided. The solar cell 40 comprises a back electrode 100, a silicon substrate 110, a doped silicon layer 120, an upper electrode 130, and an electrode lead 140. The silicon substrate 110 defines a first surface 1102 and a second surface 1104 opposite to the first surface 1102. The back electrode 100 is located on and in Ohmic contact with the second surface 1104 of the silicon substrate 110. The doped silicon layer 120 is located on the first surface 1102 of the silicon substrate 110. The upper electrode 130 is located on the doped silicon layer 120 and includes a plurality of three-dimensional nanostructures 131. The electrode lead 140 is located on the upper electrode 130. The electrode lead 140 extends along a second direction, and the second direction intersects with the extension direction of the plurality of three-dimensional nanostructures 131. The three-dimensional nanostructures 131 comprises a first rectangular structure 133, a second rectangular structure 135, and a triangular prism structure 137. The first rectangular structure 133 is located on the doped silicon layer 120. The second rectangular structure 135 is located on the first rectangular structure 133. The triangular prism structure 137 is located on the second rectangular structure 135. The width of a bottom surface of the triangular prism structure 137 is equal to the width of a top surface of the second rectangular structure 135, and is greater than the width of a top surface of the first rectangular structure 133. The materials of the first rectangular structure 133 and the triangular prism structure 137 are both metal materials.

The solar cell 40 is similar to the solar cell 10 except that the electrode lead 140 is located on both the upper electrode 130 and the doped silicon layer 120. The material of the electrode lead 140 is metal material. The electrode lead 140 is formed on the upper electrode 130 by deposition.

Figure 11:
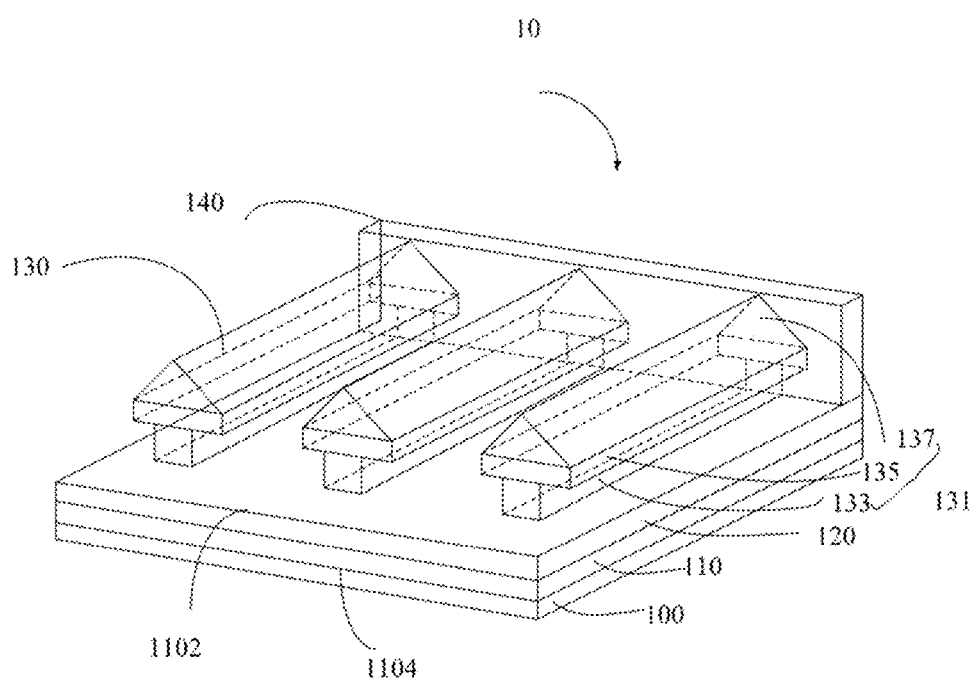
FIG. 11 is a structural schematic view of one embodiment of a solar cell.
Figure 12:
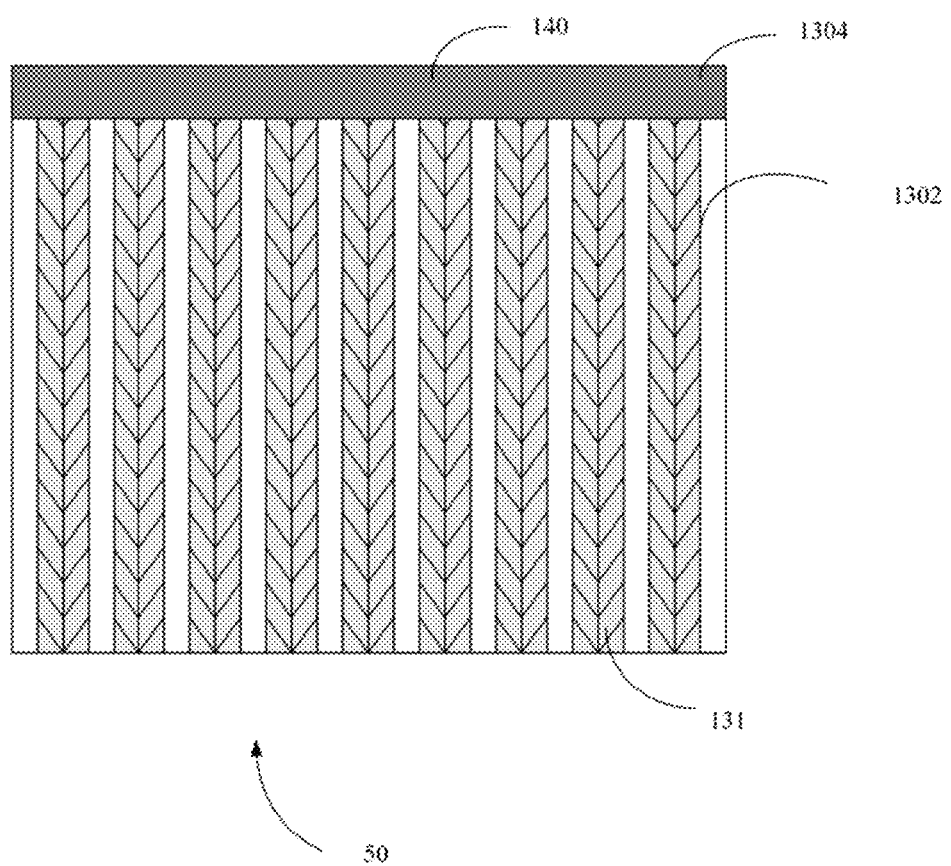
FIG. 12 is a top view of one embodiment of a solar cell.

Referring to FIG. 11 and FIG. 12, an embodiment of a solar cell 50 is provided. The solar cell 50 comprises a back electrode 100, a silicon substrate 110, a doped silicon layer 120, an upper electrode 130, and an electrode lead 140. The silicon substrate 110 defines a first surface 1102 and a second surface 1104 opposite to the first surface 1102. The back electrode 100 is located on and in Ohmic contact with the second surface 1104 of the silicon substrate 110. The doped silicon layer 120 is located on the first surface 1102 of the silicon substrate 110. The upper electrode 130 is located on the doped silicon layer 120. A surface of the upper electrode 130 away from the doped silicon layer 120 has a first area 1302 corresponding to a first part of the upper electrode 130 and a second area 1304 corresponding to a second part of the upper electrode 130. The second part of the upper electrode 130 is used as the electrode lead 140. The first part of the upper electrode 130 includes a plurality of three-dimensional nanostructures 131. The three-dimensional nanostructures 131 comprises a first rectangular structure 133, a second rectangular structure 135, and a triangular prism structure 137. The first rectangular structure 133 is located on the doped silicon layer 120. The second rectangular structure 135 is located on the first rectangular structure 133. The triangular prism structure 137 is located on the second rectangular structure 135. The width of a bottom surface of the triangular prism structure 137 is equal to the width of a top surface of the second rectangular structure 135, and is greater than the width of a top surface of the first rectangular structure 133. The materials of the first rectangular structure 133 and the triangular prism structure 137 are both metal materials.

The solar cell 50 is similar to the solar cell 10 except that the electrode lead 140 and the upper electrode 130 are an integrated structure.

In the preparation process, the material of a photoresist layer deposited on the second area 1304 is different from the material of the first mask layer 139 located on the first area 1302. Thus, when the second metal layer 136, the isolation layer 134 and the first metal layer 132 located on the first area 1302 are etched, the photoresist layer deposited on the second area 1304 can not be etched.

Figure 13:
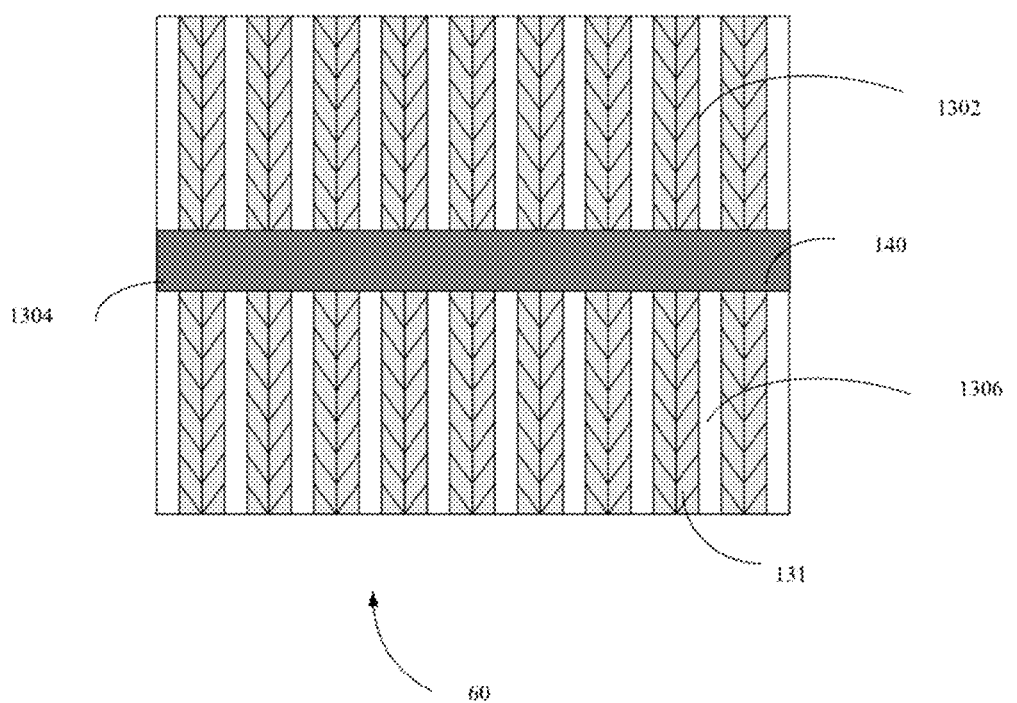
FIG. 13 is a top view of one embodiment of a solar cell.

Referring to FIG. 13, an embodiment of a solar cell 60 is provided. The solar cell 60 comprises a back electrode 100, a silicon substrate 110, a doped silicon layer 120, an upper electrode 130, and an electrode lead 140. The silicon substrate 110 defines a first surface 1102 and a second surface 1104 opposite to the first surface 1102. The back electrode 100 is located on and in Ohmic contact with the second surface 1104 of the silicon substrate 110. The doped silicon layer 120 is located on the first surface 1102 of the silicon substrate 110. The upper electrode 130 is located on the doped silicon layer 120. A surface of the upper electrode 130 away from the doped silicon layer 120 has a first area 1302 corresponding to a first part of the upper electrode 130, a second area 1304 corresponding to a second part of the upper electrode 130, and a third area 1306 corresponding to a third part of the upper electrode 130. The second part of the upper electrode 130 is used as the electrode lead 140. The first part and the third part of the upper electrode 130 include a plurality of three-dimensional nanostructures 131. The three-dimensional nanostructures 131 comprises a first rectangular structure 133, a second rectangular structure 135, and a triangular prism structure 137. The first rectangular structure 133 is located on the doped silicon layer 120. The second rectangular structure 135 is located on the first rectangular structure 133. The triangular prism structure 137 is located on the second rectangular structure 135. The width of a bottom surface of the triangular prism structure 137 is equal to the width of a top surface of the second rectangular structure 135, and is greater than the width of a top surface of the first rectangular structure 133. The materials of the first rectangular structure 133 and the triangular prism structure 137 are both metal materials.

The solar cell 60 is similar to the solar cell 10 except that the electrode lead 140 and the upper electrode 130 are an integrated structure, the upper electrode 130 includes two parts electrically connected with each other by the electrode lead 140.

In the preparation process, the material of a photoresist layer deposited on the second area 1304 is different from the material of the first mask layer 139 located on the first area 1302 and the third area 1306. Thus, when the second metal layer 136, the isolation layer 134 and the first metal layer 132 located on the first area 1302 and the third area 1306 are etched, the photoresist layer deposited on the second area 1304 can not be etched.

In operation, sunlight shines into openings of the upper electrode 130. Since each layer of the solar cell forms a resonant cavity, each resonant cavity absorbs photons and passes it to the P-N junctions. The sunlight is reflected multiple times through sidewalls of the openings to the doped silicon layer. The silicon substrate and the doped silicon layer can form a number of P-N junctions, the P-N junctions can produce a number of electron-hole pairs under excitation of the sunlight.

The plurality of three-dimensional nanostructures can realize resonance of light at different wavelengths. The third openings between adjacent triangular prism structures can achieve narrowband resonance. The half width of the narrowband resonance is in a range of 0.1 nanometers to 3 nanometers. The wavelength of the formant is in a range from near ultraviolet band to mid-infrared band. The disclosure can realize the manual operation of light. The light intensity and light conduction at nanometer scale can be controlled by using the three-dimensional nanostructures.

The solar cell of the disclosure has many advantages. The three-dimensional nanostructure consists of at least two parts, and different parts can achieve different effects. Each part constitutes a resonant cavity with a different width. Each resonant cavity can absorb photons near the corresponding resonant waves. The structure of the three-dimensional nanostructure can effectively extend the range of resonant waves. Thus, the photoelectric conversion efficiency of the solar cell can be improved.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion as to an order for the steps.

What is claimed is:

1. A solar cell, the solar cell consisting of:
a silicon substrate, the silicon substrate defines a first surface and a second surface opposite to the first surface;
a back electrode, located on the first surface of the silicon substrate;
a doped silicon layer, located on the second surface of the silicon substrate;
an upper electrode, located on the doped silicon layer, wherein the upper electrode consists of a plurality of three-dimensional nanostructures extending along a first direction;
an electrode lead, located on the upper electrode and extending along a second direction, wherein the second direction intersects with the first direction;
wherein the three-dimensional nanostructures consists of a first rectangular structure and a triangular prism structure; the first rectangular structure is located on the doped silicon layer, the triangular prism structure is located on the first rectangular structure, a first width of a bottom surface of the triangular prism structure is greater than a second width of a top surface of the first rectangular structure, the first rectangular structure consists of a first metal, the triangular prism structure consists of a second metal, the first metal is different from the second metal, and the second metal consists of one single elemental metal.

2. The solar cell as claimed in claim 1, wherein the first metal is selected from the group consisting of gold, silver, copper, and aluminum; the second metal is selected from the group consisting of gold, silver, copper, and aluminum.

3. The solar cell as claimed in claim 1, wherein the plurality of three-dimensional nanostructures are strip raised structures, and the plurality of three-dimensional nanostructures are arranged side by side and extend along a straight line, a fold line, or a curve line.

4. The solar cell as claimed in claim 1, wherein two adjacent three-dimensional nanostructures are substantially parallel with each other, and a distance between the two adjacent three-dimensional nanostructures is in a range of 40 nanometers to 450 nanometers.

5. A solar cell, the solar cell consisting of:
a silicon substrate, the silicon substrate defines a first surface and a second surface opposite to the first surface;
a back electrode, located on the first surface of the silicon substrate;
a doped silicon layer, located on the second surface of the silicon substrate;
an upper electrode, located on the doped silicon layer, wherein the upper electrode consists of a plurality of three-dimensional nanostructures extending along a first direction;
an electrode lead, located on the upper electrode and extending along a second direction, wherein the second direction intersects with the first direction;
wherein the three-dimensional nanostructures consists of a first rectangular structure, a second rectangular structure, and a triangular prism structure; the first rectangular structure is located on the doped silicon layer, the second rectangular structure is located on the first rectangular structure, the triangular prism structure is located on the second rectangular structure; a first width of a bottom surface of the triangular prism structure is equal to a second width of a top surface of the second rectangular structure, and is greater than a third width of a top surface of the first rectangular structure, and materials of the first rectangular structure and the triangular prism structure are metal.

6. The solar cell as claimed in claim 5, wherein the doped silicon layer is an N-type doped silicon layer.

7. The solar cell as claimed in claim 2, wherein the first metal consists of one metal material.

8. The solar cell as claimed in claim 2, wherein a material of the back electrode is metal or carbon.

9. The solar cell as claimed in claim 2, wherein a material of the electrode lead is metal or carbon.

10. The solar cell as claimed in claim 2, wherein the upper electrode and the electrode lead are an integrated structure.

* * * * *